United States Patent [19]
Orchard

[11] 4,063,187
[45] Dec. 13, 1977

[54] EQUALIZER CIRCUIT

[75] Inventor: Henry John Orchard, Santa Monica, Calif.

[73] Assignee: GTE Automatic Electric Laboratories Incorporated, Northlake, Ill.

[21] Appl. No.: 637,789

[22] Filed: Dec. 4, 1975

[51] Int. Cl.² ............................................. H03F 1/36
[52] U.S. Cl. .................................... 330/107; 330/109; 333/28 R; 333/80 R
[58] Field of Search ............. 330/107, 109; 333/28 R, 333/80 T, 80 R; 328/167

[56] References Cited
U.S. PATENT DOCUMENTS

| | | | |
|---|---|---|---|
| 3,646,464 | 2/1972 | Boggs | 330/107 X |
| 3,753,140 | 8/1973 | Feistel | 330/109 |

*Primary Examiner*—Lawrence J. Dahl
*Attorney, Agent, or Firm*—Leonard R. Cool; Russell A. Cannon

[57] ABSTRACT

A Bode equalizer which has as one active element thereof a high-gain, differential-input amplifier and which has as a second active element a variable negative resistance, the equalizer circuit being controlled by a resistance arrangement which effectively comprises a series-connected, fixed resistor and the variable negative resistance.

11 Claims, 4 Drawing Figures

EQUALIZER CIRCUIT

BACKGROUND OF THE INVENTION

1. Field of Invention

The invention relates to equalizing structures arranged to compensate for variations in the phase and attenuation characteristics of transmission lines and other pieces of apparatus; and more specifically, to the type of attenuation equalizer sometimes referred to as a Bode equalizer and as disclosed in U.S. Pat. No. 2,096,027.

2. Description of Prior Art

Ordinarily equalizer circuits have definite characteristics determined by the particular apparatus with which they are associated. Frequently, however, the equalizing requirements cannot be determined in advance either because the characteristics of the associated apparatus are not known with sufficient precision or because they vary with time. Examples are found in the equalization of transmission lines where the exact length is not known, or where the characteristics may be affected by changes in temperature and humidity. In such instances, an adjustable equalizer is required. The Bode equalizer is of this type.

The Bode equalizer has, inter alia, two desirable features:

a. The adjustment is accomplished by varying resistors only; and
b. The correction remains proportional, i.e., a design that is proper for equalizing 2,000 feet of cable will automatically be correct, when the resistors are adjusted, for equalizing the proportional attenuation shape resulting from 1,000 feet of cable, or even a negative length (i.e., cable simulation).

The Bode networks have, among others, two disadvantages which are:

a. All Bode networks contain one or more inductors; and
b. when set to produce no equalization, the more useful Bode networks have a constant insertion loss proportional to the maximum correction envisioned.

The presence of this constant component of the insertion loss may significantly reduce the signal-to-noise ratio. The use of preamplifiers to boost the signal level and so to overcome the inherent attenuation of the Bode equalizer may thus sometimes be necessary.

More recently, the analysis of active variable equalizers has been discussed by Franc Brglez in a paper entitled, "Inductorless Variable Equalizers Using All-Pass Network Structures," Proceedings 1974, IEEE International Symposium on Circuits and Systems, Apr. 22 - 25, 1974, San Francisco, California, at pages 448 - 452. A different variable equalizer structure is disclosed by the same author in a paper entitled, "Minimally Active RC Variable Equalizers," IEEE Transactions on Circuits and Systems, vol. CAS-22, No. 8, August 1975, at pages 688 - 691.

SUMMARY OF THE INVENTION

The present equalizer circuit retains the desirable features of the Bode network while eliminating both the disadvantages of the Bode network noted above. For example, the present circuit can be designed to equalize for variations in loss with frequency without using any inductors. This is a particular advantage in miniaturized circuit applications. However, the use of inductors is not precluded in the present circuit. Further, the equalizer of the invention has no constant insertion loss when set for zero equalization.

Another feature of the present invention is the provision of an equalizer circuit in which the number of reactive elements is one-fourth the number in a constant-resistance Bode equalizer, and one-half of that in a nonconstant-resistance Bode equalizer.

Another feature of the present invention is to provide an equalizer circuit which will have a wide application of use, including by way of example: the equalizing of transmission systems having a sloping frequency imperfection and the equalizing of a corner characteristic of a bandpass filter.

The invention possesses other objects and features of advantage, some of which of the foregoing will be set forth in the following description of the preferred form of the invention which is illustrated in the drawing accompanying and forming part of this specification. It is to be understood, however, that variations in the showing made by the said drawing and description may be adopted within the scope of the invention as set forth in the claims.

DETAILED DESCRIPTION OF INVENTION

Figure 1:
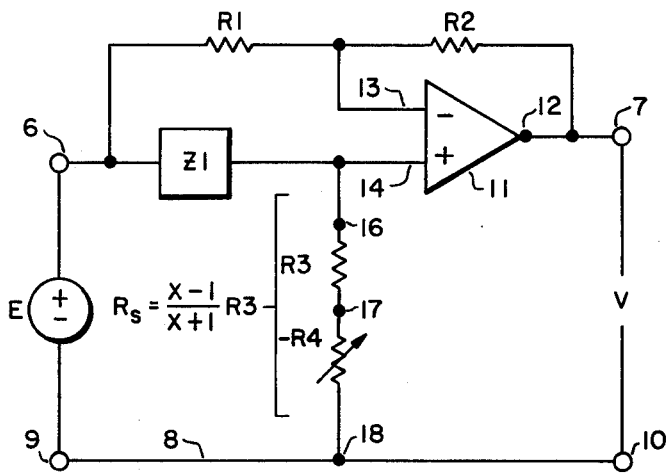
FIG. 1. is a schematic diagram of an equalizer circuit constructed in accordance with the present invention.

The equalizer circuit of the present invention is provided with input and output terminals 6 and 7 and a common ground or reference 8 having terminals 9 and 10 at the input and output of the circuit; the circuit comprising, briefly, a very high-gain differential amplifier, such as a differential-input operational amplifier, 11, having an output 12 connected to output terminal 7, and having the usual inverting and noninverting inputs 13 and 14; a first impedance $Z_1$ connected between input terminal 6 and the amplifier noninverting input 14; first and second resistors $R_1$ and $R_2$ connected one between input 13 and input terminal 6 and the other connected between amplifier output 12 and amplifier input 13; and the shunt-resistance combination of a fixed resistor $R_3$ and a variable negative resistance $-R_4$ connected in series between amplifier input 14 and common reference 8. Resistors $R_1$ and $R_2$ often have the same value of resistance.

Figure 2:
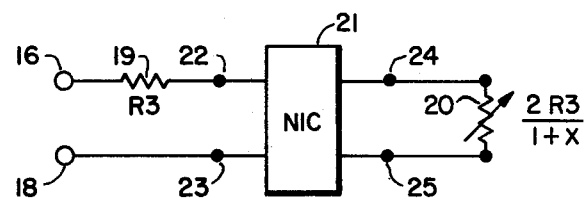
FIG. 2 is a developed schematic diagram of a preferred circuit for deriving the shunt resistance including a negative impedance converter which is used to derive the variable negative resistance.

To provide stability, impedance $Z_1$ should have a resistive value $R_A$ which is greater in magnitude than the resistance of $R_3$. As an example, a simple series resistive-capacitive network with impedance such as $R_A + 1/sC$ may be used, where $s$ represents the complex frequency variable. The variable negative resistance $-R_4$ has preferably a selected relationship to the value of the fixed resistance $R_3$ so as to obtain a range of resistance values from $-R_3$ to $+R_3$ between terminals 16 and 18. In the configuration shown in FIG. 1, the shunt resistance $R_s = R_3 + (-R_4)$. To obtain the range of values specified above, $R_s$ varies according to the relation $R_s = R_3(x - 1)/(x + 1)$ where $x$ is a variable parameter which may vary from zero to infinity. If $x = 0$, $R_s = -R_3$; and if $x = \infty$, or in the practical case if $x$ is large with respect to 1, $R_s = +R_3$. The variable negative resistance $-R_4$ may be provided by any two-port network that converts a positive variable resistance terminating one port into the negative of that resistance as seen at the other port. It should be noted that it would appear to be more desirable to have $R_3$ variable and $-R_4$ fixed. However, in many practical applications it is desirable to have the variable resistance automatically controlled, for example by a current derived from a pilot signal. For such applications it is particularly desirable that the variable resistor not float, but rather have one side connected to ground. This could be achieved only by interchanging the order in which $R_3$ and $-R_4$ appear in the series branch forming $R_s$ in FIG. 1. If this were done, the active circuitry required to create the negative resistance $-R_4$ would then be floating from ground, and consequently a problem would arise in supplying power to both this active circuitry and the operational amplifier 11 from a common grounded power supply. A preferred way to resolve the problem is to use the circuit configuration in FIG. 2. In this circuit, the effective resistance of $R_s$ appears between terminals 16 and 18. Resistor 19 is fixed and has a positive value equal to $R_3$. Resistor 20 is variable and has the value $R_{20} = 2R_3/(1 + x)$, where $x$ may vary from zero to infinity. $R_{20}$ is connected to one port, terminals 24 – 25, of the negative-impedance converter 21. The value of resistance $R_{20}$ is converted to the negative of that value at the other port, terminals 22 – 23, which puts the negative variable resistance in series with resistor 19. The value of $R_{20}$ varies as follows: if $R_{20} = 2R_3$, i.e., $x = 0$, an effective shunt resistance, $R_s$, of $-R_3$ is obtained between terminals 16 and 18; if $R_{20} = R_3$, i.e., $x = 1$, then $R_s = 0$; and if $R_{20} = 0$, i.e., $x = \infty$, then $R_s = +R_3$.

Figure 3:
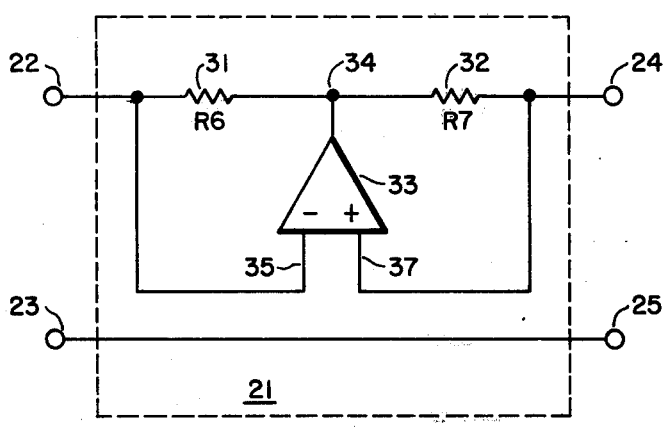
FIG. 3 is a schematic diagram of a negative impedance converter for use in a preferred embodiment of the invention.

A negative impedance converter which may be used to practice this invention is shown in FIG. 3. It comprises briefly, a circuit having two ports, one formed by terminals 22 and 23 and one formed by terminals 24 and 25; a differential-input operational amplifier 33 having an output 34 and customary inverting and noninverting inputs 35 and 37, with inverting input 35 connected to terminal 22 and noninverting input 37 to terminal 24; resistances $R_6$ and $R_7$ connected one between amplifier output 34 and each of the terminals 22 and 24. Normally $R_6$ and $R_7$ have equal resistance values. In the orientation shown, terminal 22 is connected via resistor 19 to input 14 of amplifier 11, and terminal 23 is connected to the ground terminal 18.

Figure 4:
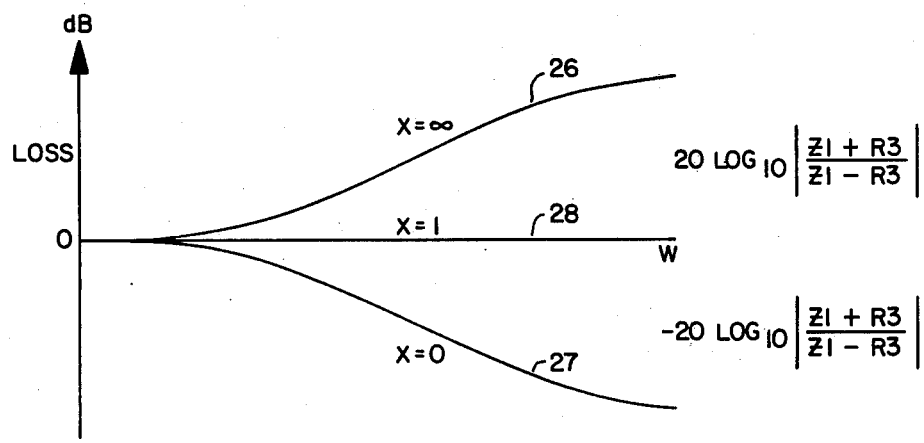
FIG. 4 is a graph showing the equalization characteristics of the present circuit.

The attenuation characteristics of the present circuit are illustrated in FIG. 4. A selection of equal resistances, for $R_1$ and $R_2$, will provide symmetry of the two insertion loss curves 26 and 27 with respect to a zero loss line 28. This symmetry may be changed, where it is advantageous so to do, by changing the values of resistors $R_1$ and $R_2$. By making these resistors equal, however, a simplicity and design advantage is obtained in that these resistive values cancel out in the overall ratio of output voltage, V, to input voltage, E, that is provided by the circuit. In such case, this ratio may be expressed:

$$\frac{V}{E} = -\frac{Z_1 - R_3 \frac{x-1}{x+1}}{Z_1 + R_3 \frac{x-1}{x+1}} = -\frac{x + \frac{Z_1 + R_3}{Z_1 - R_3}}{1 + x\frac{Z_1 + R_3}{Z_1 - R_3}}.$$

The selection of $Z_1$ will determine the shape of the two curves 26 and 27. If $Z_1 = R_4 + 1/sC$ as above suggested and $R_1 = R_2$, then $$\frac{Z_1 + R_3}{Z_1 - R_3} = \frac{sC(R_4 + R_3) + 1}{sC(R_4 - R_3) + 1}.$$

Now if $R_4$ is selected as greater than $R_3$, the general shape of curves 26 and 27, as illustrated in FIG. 3, will be obtained where the upper curve 26 may be represented by the expression:

$$20 \log_{10} \left| \frac{Z_1 + R_3}{Z_1 - R_3} \right| dB$$

and the lower curve may be represented by the expression:

$$-20 \log_{10} \left| \frac{Z_1 + R_3}{Z_1 - R_3} \right| dB.$$

The sloping shape of curves 26 and 27 is of particular advantage for equalizing cables in communication systems. The values of $R_4$ and C will be selected to give the slope desired over the particular frequency range of interest.

Another advantage of the present circuit is that it has low output impedance which facilitates the cascading of the equalizer with other circuits.

What is claimed is:

1. An active minimum-phase equalizer, which provides the special characteristics of a passive Bode equalizer circuit, said equalizer having input and output terminals and a common reference comprising:
    a differential input operational amplifier having an output connected to said output terminal, and having first and second inputs;
    a first impedance $Z_1$ connected between said input terminal and said amplifier first input;
    a first resistor $R_1$ connected between said input terminal and said amplifier second input, and a second resistor $R_2$ connected between said amplifier output and said amplifier second input; and
    a fixed resistance and a variable negative resistance connected in series between said amplifier first input and said common reference.

2. A circuit as defined in claim 1 wherein said first and second resistors comprise resistors of substantially equal value.

3. A circuit as defined in claim 1 wherein said fixed resistance has a value of $R_3$ and said variable negative resistance, $-R_4$, has a value of $-2R_3/(x + 1)$, where $x$ is a variable parameter taking positive values between zero and infinity.

4. A circuit as defined in claim 3 wherein said fixed resistance provides a resistance, $R_3$, and said variable negative resistance contains a variable resistor having a value of $2R_3/(x + 1)$.

5. A circuit as defined in claim 4 wherein said first impedance contains a resistive value, $R_4$, greater than $R_3$.

6. A circuit as defined in claim 3 wherein said first impedance comprises a series resistive-capacitive network represented by the expression $R_4 + 1/sC$, where $s$ represents the complex frequency variable.

7. A circuit as defined in claim 6 wherein said fixed resistance has a value $R_3$, and $R_4$ is greater than $R_3$.

8. A circuit as defined in claim 7 wherein said variable negative resistance comprises a negative impedance converter and a variable resistor having the value $2R_3/(x + 1)$, where $x$ is a parameter taking positive values from zero to infinity.

9. A circuit as defined in claim 7 wherein said second and third resistances comprise resistors of substantially equal value.

10. A circuit as defined in claim 1 wherein said variable negative resistance comprises a two-port network including:
- a second differential input operational amplifier having an output and first and second inputs, said second amplifier first input being connected to one terminal of the first port and the second input being connected to one terminal of the second port;
- sixth and seventh resistors, $R_6$ and $R_7$, connected one between said second amplifier output and each of its said inputs; and
- a variable resistance terminating the second port.

11. A circuit as defined in claim 10 wherein said sixth and seventh resistors have substantially equal value.

* * * * *

UNITED STATES PATENT AND TRADEMARK OFFICE
CERTIFICATE OF CORRECTION

PATENT NO. : 4,063,187
DATED : December 13, 1977
INVENTOR(S) : Henry John Orchard It is certified that error appears in the above-identified patent and that said Letters Patent are hereby corrected as shown below:

Column 3, line 3, after "0, $R_s = -R_3$;" insert -- if $x = 1$, $R_s = 0$; --.

Signed and Sealed this

Eighteenth Day of April 1978

[SEAL]

Attest:

RUTH C. MASON
*Attesting Officer*

LUTRELLE F. PARKER
*Acting Commissioner of Patents and Trademarks*